US009082753B2

(12) United States Patent
Haba et al.

(10) Patent No.: US 9,082,753 B2
(45) Date of Patent: Jul. 14, 2015

(54) SEVERING BOND WIRE BY KINKING AND TWISTING

(71) Applicant: Invensas Corporation, San Jose, CA (US)

(72) Inventors: Belgacem Haba, Saratoga, CA (US); Reynaldo Co, Santa Cruz, CA (US); Rizza Lee Saga Cizek, Brentwood, CA (US); Wael Zohni, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/297,701

(22) Filed: Jun. 6, 2014

(65) Prior Publication Data

US 2015/0129647 A1  May 14, 2015

Related U.S. Application Data

(63) Continuation-in-part of application No. 14/077,597, filed on Nov. 12, 2013.

(51) Int. Cl.
*B23K 31/02* (2006.01)
*H01L 21/44* (2006.01)
*H01L 23/00* (2006.01)
(Continued)

(52) U.S. Cl.
CPC ............ *H01L 24/43* (2013.01); *B23K 20/004* (2013.01); *B23K 20/005* (2013.01); *B23K 20/007* (2013.01); *H01L 21/4853* (2013.01); *H01L 23/49811* (2013.01); *H01L 24/85* (2013.01); *H01L 2224/432* (2013.01); *H01L 2224/4382* (2013.01); *H01L 2224/43985* (2013.01); *H01L 2924/2064* (2013.01)

(58) Field of Classification Search
None
See application file for complete search history.

(56) References Cited

U.S. PATENT DOCUMENTS 3,289,452 A   12/1966   Koellner
3,358,897 A   12/1967   Christensen
(Continued)

FOREIGN PATENT DOCUMENTS

CN   102324418 A   1/2012
EP   920058   6/1999
(Continued)

OTHER PUBLICATIONS

Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.

(Continued)

*Primary Examiner* — Kiley Stoner
(74) *Attorney, Agent, or Firm* — Lerner, David, Littenberg, Krumholz & Mentlik, LLP

(57) ABSTRACT

An electrically conductive lead is formed using a bonding tool. After bonding the wire to a metal surface and extending a length of the wire beyond the bonding tool, the wire is clamped. Movement of the bonding tool imparts a kink to the wire at a location where the wire is fully separated from any metal element other than the bonding tool. A forming element, e.g., an edge or a blade skirt provided at an exterior surface of the bonding tool can help kink the wire. Twisting the wire while tensioning the wire using the bonding tool can cause the wire to break and define an end. The lead then extends from the metal surface to the end, and may exhibits a sign of the torsional force applied thereto.

19 Claims, 11 Drawing Sheets

(51) Int. Cl.
  *B23K 20/00* (2006.01)
  *H01L 23/498* (2006.01)
  *H01L 21/48* (2006.01)

(56) References Cited

U.S. PATENT DOCUMENTS

| | | | |
|---|---|---|---|
| 3,623,649 A | 11/1971 | Keisling | |
| 3,795,037 A | 3/1974 | Luttmer | |
| 3,900,153 A | 8/1975 | Beerwerth et al. | |
| 4,327,860 A | 5/1982 | Kirshenboin et al. | |
| 4,415,115 A * | 11/1983 | James | 228/170 |
| 4,422,568 A | 12/1983 | Elles et al. | |
| 4,437,604 A | 3/1984 | Razon et al. | |
| 4,604,644 A | 8/1986 | Beckham et al. | |
| 4,695,870 A | 9/1987 | Patraw | |
| 4,716,049 A | 12/1987 | Patraw | |
| 4,771,930 A | 9/1988 | Gillotti et al. | |
| 4,793,814 A | 12/1988 | Zifcak et al. | |
| 4,804,132 A | 2/1989 | DiFrancesco | |
| 4,902,600 A | 2/1990 | Tamagawa et al. | |
| 4,924,353 A | 5/1990 | Patraw | |
| 4,975,079 A | 12/1990 | Beaman et al. | |
| 4,976,392 A * | 12/1990 | Smith et al. | 228/102 |
| 4,982,265 A | 1/1991 | Watanabe et al. | |
| 4,998,885 A | 3/1991 | Beaman | |
| 4,999,472 A | 3/1991 | Neinast et al. | |
| 5,014,111 A * | 5/1991 | Tsuda et al. | 257/737 |
| 5,067,382 A | 11/1991 | Zimmerman et al. | |
| 5,083,697 A | 1/1992 | Difrancesco | |
| 5,095,187 A | 3/1992 | Gliga | |
| 5,138,438 A | 8/1992 | Masayuki et al. | |
| 5,148,265 A | 9/1992 | Khandros et al. | |
| 5,148,266 A | 9/1992 | Khandros et al. | |
| 5,186,381 A | 2/1993 | Kim | |
| 5,189,505 A | 2/1993 | Bartelink | |
| 5,196,726 A | 3/1993 | Nishiguchi et al. | |
| 5,214,308 A | 5/1993 | Nishiguchi et al. | |
| 5,220,489 A | 6/1993 | Barreto et al. | |
| 5,222,014 A | 6/1993 | Lin | |
| 5,340,771 A | 8/1994 | Rostoker | |
| 5,364,004 A * | 11/1994 | Davidson | 228/1.1 |
| 5,371,654 A | 12/1994 | Beaman et al. | |
| 5,397,997 A | 3/1995 | Tuckerman et al. | |
| 5,438,224 A | 8/1995 | Papageorge et al. | |
| 5,455,390 A | 10/1995 | DiStefano et al. | |
| 5,494,667 A | 2/1996 | Uchida et al. | |
| 5,495,667 A | 3/1996 | Farnworth et al. | |
| 5,518,964 A | 5/1996 | DiStefano et al. | |
| 5,531,022 A | 7/1996 | Beaman et al. | |
| 5,536,909 A | 7/1996 | DiStefano et al. | |
| 5,541,567 A | 7/1996 | Fogel et al. | |
| 5,559,054 A * | 9/1996 | Adamjee | 438/617 |
| 5,571,428 A | 11/1996 | Nishimura et al. | |
| 5,608,265 A | 3/1997 | Kitano et al. | |
| 5,615,824 A | 4/1997 | Fjelstad et al. | |
| 5,635,846 A | 6/1997 | Beaman et al. | |
| 5,656,550 A | 8/1997 | Tsuji et al. | |
| 5,659,952 A | 8/1997 | Kovac et al. | |
| 5,679,977 A | 10/1997 | Khandros et al. | |
| 5,686,353 A * | 11/1997 | Yagi et al. | 438/15 |
| 5,688,716 A | 11/1997 | DiStefano et al. | |
| 5,715,989 A * | 2/1998 | Kee | 228/114.5 |
| 5,726,493 A | 3/1998 | Yamashita et al. | |
| 5,731,709 A | 3/1998 | Pastore et al. | |
| 5,736,780 A | 4/1998 | Murayama | |
| 5,787,581 A | 8/1998 | DiStefano et al. | |
| 5,801,441 A | 9/1998 | DiStefano et al. | |
| 5,802,699 A | 9/1998 | Fjelstad et al. | |
| 5,811,982 A | 9/1998 | Beaman et al. | |
| 5,821,763 A | 10/1998 | Beaman et al. | |
| 5,831,836 A | 11/1998 | Long et al. | |
| 5,854,507 A | 12/1998 | Miremadi et al. | |
| 5,868,300 A * | 2/1999 | Babayan | 228/180.5 |
| 5,898,991 A | 5/1999 | Fogel et al. | |
| 5,912,505 A | 6/1999 | Itoh et al. | |
| 5,953,624 A | 9/1999 | Bando et al. | |
| 5,971,253 A | 10/1999 | Gilleo et al. | |
| 5,973,391 A | 10/1999 | Bischoff et al. | |
| 5,977,618 A | 11/1999 | DiStefano et al. | |
| 5,980,270 A | 11/1999 | Fjelstad et al. | |
| 5,989,936 A | 11/1999 | Smith et al. | |
| 5,994,152 A | 11/1999 | Khandros et al. | |
| 6,002,168 A | 12/1999 | Bellaar et al. | |
| 6,032,359 A | 3/2000 | Carroll | |
| 6,038,136 A | 3/2000 | Weber | |
| 6,052,287 A | 4/2000 | Palmer et al. | |
| 6,054,337 A | 4/2000 | Solberg | |
| 6,054,756 A | 4/2000 | DiStefano et al. | |
| 6,077,380 A | 6/2000 | Hayes et al. | |
| 6,117,694 A | 9/2000 | Smith et al. | |
| 6,121,676 A | 9/2000 | Solberg | |
| 6,124,546 A | 9/2000 | Hayward et al. | |
| 6,133,072 A | 10/2000 | Fjelstad | |
| 6,157,080 A | 12/2000 | Tamaki et al. | |
| 6,158,647 A | 12/2000 | Chapman et al. | |
| 6,164,523 A | 12/2000 | Fauty et al. | |
| 6,177,636 B1 | 1/2001 | Fjelstad | |
| 6,194,250 B1 | 2/2001 | Melton et al. | |
| 6,194,291 B1 | 2/2001 | DiStefano et al. | |
| 6,202,297 B1 | 3/2001 | Faraci et al. | |
| 6,206,273 B1 | 3/2001 | Beaman et al. | |
| 6,208,024 B1 | 3/2001 | DiStefano | |
| 6,211,461 B1 | 4/2001 | Park et al. | |
| 6,211,572 B1 | 4/2001 | Fjelstad et al. | |
| 6,215,670 B1 | 4/2001 | Khandros | |
| 6,218,728 B1 | 4/2001 | Kimura | |
| 6,225,688 B1 | 5/2001 | Kim et al. | |
| 6,258,625 B1 | 7/2001 | Brofman et al. | |
| 6,260,264 B1 | 7/2001 | Chen et al. | |
| 6,262,482 B1 | 7/2001 | Shiraishi et al. | |
| 6,295,729 B1 | 10/2001 | Beaman et al. | |
| 6,300,780 B1 | 10/2001 | Beaman et al. | |
| 6,303,997 B1 | 10/2001 | Lee et al. | |
| 6,313,528 B1 | 11/2001 | Solberg | |
| 6,316,838 B1 | 11/2001 | Ozawa et al. | |
| 6,332,270 B2 | 12/2001 | Beaman et al. | |
| 6,334,247 B1 | 1/2002 | Beaman et al. | |
| 6,358,627 B2 | 3/2002 | Benenati et al. | |
| 6,362,520 B2 | 3/2002 | DiStefano | |
| 6,362,525 B1 | 3/2002 | Rahim | |
| 6,388,333 B1 | 5/2002 | Taniguchi et al. | |
| 6,407,448 B2 | 6/2002 | Chun | |
| 6,439,450 B1 | 8/2002 | Chapman et al. | |
| 6,458,411 B1 | 10/2002 | Goossen et al. | |
| 6,476,503 B1 | 11/2002 | Imamura et al. | |
| 6,476,583 B2 | 11/2002 | McAndrews | |
| 6,495,914 B1 | 12/2002 | Sekine et al. | |
| 6,507,104 B2 | 1/2003 | Ho et al. | |
| 6,509,639 B1 | 1/2003 | Lin | |
| 6,514,847 B1 | 2/2003 | Ohsawa et al. | |
| 6,515,355 B1 | 2/2003 | Jiang et al. | |
| 6,522,018 B1 | 2/2003 | Tay et al. | |
| 6,526,655 B2 | 3/2003 | Beaman et al. | |
| 6,531,784 B1 | 3/2003 | Shim et al. | |
| 6,545,228 B2 | 4/2003 | Hashimoto | |
| 6,550,666 B2 | 4/2003 | Chew et al. | |
| 6,555,918 B2 | 4/2003 | Masuda et al. | |
| 6,560,117 B2 | 5/2003 | Moon | |
| 6,573,458 B1 | 6/2003 | Matsubara et al. | |
| 6,578,754 B1 | 6/2003 | Tung | |
| 6,581,283 B2 * | 6/2003 | Sugiura et al. | 29/843 |
| 6,624,653 B1 | 9/2003 | Cram | |
| 6,630,730 B2 | 10/2003 | Grigg | |
| 6,647,310 B1 | 11/2003 | Yi et al. | |
| 6,684,007 B2 | 1/2004 | Yoshimura et al. | |
| 6,687,988 B1 * | 2/2004 | Sugiura et al. | 29/843 |
| 6,699,730 B2 | 3/2004 | Kim et al. | |
| 6,708,403 B2 | 3/2004 | Beaman et al. | |
| 6,730,544 B1 | 5/2004 | Yang | |
| 6,734,542 B2 | 5/2004 | Nakatani et al. | |
| 6,746,894 B2 | 6/2004 | Fee et al. | |
| 6,762,078 B2 | 7/2004 | Shin et al. | |
| 6,765,287 B1 | 7/2004 | Lin | |
| 6,774,467 B2 | 8/2004 | Horiuchi et al. | |

(56) References Cited

U.S. PATENT DOCUMENTS

| | | |
|---|---|---|
| 6,774,473 B1 | 8/2004 | Shen |
| 6,774,494 B2 | 8/2004 | Arakawa |
| 6,777,787 B2 | 8/2004 | Shibata |
| 6,790,757 B1 | 9/2004 | Chittipeddi et al. |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,900,530 B1 | 5/2005 | Tsai |
| 6,902,869 B2 | 6/2005 | Appelt et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,979,599 B2 | 12/2005 | Silverbrook |
| 6,987,032 B1 | 1/2006 | Fan et al. |
| 7,009,297 B1 | 3/2006 | Chiang et al. |
| 7,045,884 B2 | 5/2006 | Standing |
| 7,051,915 B2 | 5/2006 | Mutaguchi |
| 7,061,079 B2 | 6/2006 | Weng et al. |
| 7,067,911 B1 | 6/2006 | Lin et al. |
| 7,119,427 B2 | 10/2006 | Kim |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,262,124 B2 | 8/2007 | Fujisawa |
| 7,294,928 B2 | 11/2007 | Bang et al. |
| 7,323,767 B2 | 1/2008 | James et al. |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,456,091 B2 | 11/2008 | Kuraya et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,621,436 B2 | 11/2009 | Mii et al. |
| 7,633,765 B1 | 12/2009 | Scanlan et al. |
| 7,642,133 B2 | 1/2010 | Wu et al. |
| 7,646,102 B2 | 1/2010 | Boon |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,351 B1 | 8/2010 | Berry et al. |
| 7,780,064 B2 | 8/2010 | Wong et al. |
| 7,795,717 B2 | 9/2010 | Goller |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,880,290 B2 | 2/2011 | Park |
| 7,892,889 B2 | 2/2011 | Howard et al. |
| 7,919,846 B2 | 4/2011 | Hembree |
| 7,932,170 B1 | 4/2011 | Huemoeller et al. |
| 7,934,313 B1 | 5/2011 | Lin et al. |
| 7,934,634 B2* | 5/2011 | Mii et al. .................. 228/180.5 |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,039,970 B2 | 10/2011 | Yamamori et al. |
| 8,071,470 B2 | 12/2011 | Khor et al. |
| 8,084,867 B2 | 12/2011 | Tang et al. |
| 8,092,734 B2 | 1/2012 | Jiang et al. |
| 8,093,697 B2 | 1/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,304,900 B2 | 11/2012 | Jang et al. |
| 8,372,741 B1* | 2/2013 | Co et al. .................. 438/617 |
| 8,772,152 B2* | 7/2014 | Co et al. .................. 438/617 |
| 8,940,630 B2* | 1/2015 | Damberg et al. .......... 438/617 |
| 2001/0002607 A1 | 6/2001 | Sugiura et al. |
| 2001/0007370 A1 | 7/2001 | Distefano |
| 2001/0020545 A1 | 9/2001 | Eldridge et al. |
| 2001/0021541 A1 | 9/2001 | Akram et al. |
| 2001/0023534 A1* | 9/2001 | Tamai et al. .................. 29/843 |
| 2001/0028114 A1 | 10/2001 | Hosomi |
| 2002/0014004 A1 | 2/2002 | Beaman et al. |
| 2002/0023942 A1* | 2/2002 | Terakado et al. .......... 228/180.5 |
| 2002/0066952 A1 | 6/2002 | Taniguchi et al. |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0185735 A1 | 12/2002 | Sakurai et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094700 A1 | 5/2003 | Aiba et al. |
| 2003/0106213 A1 | 6/2003 | Beaman et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2004/0026480 A1* | 2/2004 | Imai et al. .................. 228/110.1 |
| 2004/0036164 A1 | 2/2004 | Koike et al. |
| 2004/0038447 A1 | 2/2004 | Corisis et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1* | 8/2004 | Babinetz et al. .............. 438/617 |
| 2004/0160751 A1 | 8/2004 | Inagaki et al. |
| 2004/0164128 A1* | 8/2004 | Mii .......................... 228/180.5 |
| 2004/0188499 A1 | 9/2004 | Nosaka |
| 2004/0262734 A1 | 12/2004 | Yoo |
| 2005/0035440 A1 | 2/2005 | Mohammed |
| 2005/0062492 A1 | 3/2005 | Beaman et al. |
| 2005/0082664 A1 | 4/2005 | Funaba et al. |
| 2005/0092815 A1* | 5/2005 | Mii .......................... 228/180.5 |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |

(56) References Cited

U.S. PATENT DOCUMENTS

| | | | |
|---|---|---|---|
| 2006/0118641 A1 | 6/2006 | Hwang et al. | |
| 2006/0166397 A1 | 7/2006 | Lau et al. | |
| 2006/0175383 A1* | 8/2006 | Mii et al. | 228/180.5 |
| 2006/0197220 A1 | 9/2006 | Beer | |
| 2006/0216863 A1* | 9/2006 | Arakawa | 438/118 |
| 2006/0255449 A1 | 11/2006 | Lee et al. | |
| 2006/0278682 A1 | 12/2006 | Lange et al. | |
| 2007/0015353 A1 | 1/2007 | Craig et al. | |
| 2007/0148822 A1 | 6/2007 | Haba et al. | |
| 2007/0181989 A1 | 8/2007 | Corisis et al. | |
| 2007/0190747 A1 | 8/2007 | Humpston et al. | |
| 2007/0231959 A1* | 10/2007 | Seidel et al. | 438/106 |
| 2007/0235850 A1 | 10/2007 | Gerber et al. | |
| 2007/0246513 A1* | 10/2007 | Tei et al. | 228/101 |
| 2007/0271781 A9 | 11/2007 | Beaman et al. | |
| 2007/0290325 A1 | 12/2007 | Wu et al. | |
| 2008/0017968 A1 | 1/2008 | Choi et al. | |
| 2008/0032519 A1 | 2/2008 | Murata | |
| 2008/0047741 A1 | 2/2008 | Beaman et al. | |
| 2008/0048309 A1 | 2/2008 | Corisis et al. | |
| 2008/0048690 A1 | 2/2008 | Beaman et al. | |
| 2008/0048691 A1 | 2/2008 | Beaman et al. | |
| 2008/0048697 A1 | 2/2008 | Beaman et al. | |
| 2008/0054434 A1 | 3/2008 | Kim | |
| 2008/0073769 A1 | 3/2008 | Wu et al. | |
| 2008/0073771 A1 | 3/2008 | Seo et al. | |
| 2008/0076208 A1 | 3/2008 | Wu et al. | |
| 2008/0100316 A1 | 5/2008 | Beaman et al. | |
| 2008/0100317 A1 | 5/2008 | Beaman et al. | |
| 2008/0100318 A1 | 5/2008 | Beaman et al. | |
| 2008/0100324 A1 | 5/2008 | Beaman et al. | |
| 2008/0106281 A1 | 5/2008 | Beaman et al. | |
| 2008/0106282 A1 | 5/2008 | Beaman et al. | |
| 2008/0106283 A1 | 5/2008 | Beaman et al. | |
| 2008/0106284 A1 | 5/2008 | Beaman et al. | |
| 2008/0106285 A1 | 5/2008 | Beaman et al. | |
| 2008/0106291 A1 | 5/2008 | Beaman et al. | |
| 2008/0106872 A1 | 5/2008 | Beaman et al. | |
| 2008/0111568 A1 | 5/2008 | Beaman et al. | |
| 2008/0111569 A1 | 5/2008 | Beaman et al. | |
| 2008/0111570 A1 | 5/2008 | Beaman et al. | |
| 2008/0112144 A1 | 5/2008 | Beaman et al. | |
| 2008/0112145 A1 | 5/2008 | Beaman et al. | |
| 2008/0112146 A1 | 5/2008 | Beaman et al. | |
| 2008/0112147 A1 | 5/2008 | Beaman et al. | |
| 2008/0112148 A1 | 5/2008 | Beaman et al. | |
| 2008/0112149 A1 | 5/2008 | Beaman et al. | |
| 2008/0116912 A1 | 5/2008 | Beaman et al. | |
| 2008/0116913 A1 | 5/2008 | Beaman et al. | |
| 2008/0116914 A1 | 5/2008 | Beaman et al. | |
| 2008/0116915 A1 | 5/2008 | Beaman et al. | |
| 2008/0116916 A1 | 5/2008 | Beaman et al. | |
| 2008/0117611 A1 | 5/2008 | Beaman et al. | |
| 2008/0117612 A1 | 5/2008 | Beaman et al. | |
| 2008/0117613 A1 | 5/2008 | Beaman et al. | |
| 2008/0121879 A1 | 5/2008 | Beaman et al. | |
| 2008/0123310 A1 | 5/2008 | Beaman et al. | |
| 2008/0129319 A1 | 6/2008 | Beaman et al. | |
| 2008/0129320 A1 | 6/2008 | Beaman et al. | |
| 2008/0132094 A1 | 6/2008 | Beaman et al. | |
| 2008/0156518 A1 | 7/2008 | Honer et al. | |
| 2008/0164595 A1 | 7/2008 | Wu et al. | |
| 2008/0197510 A1* | 8/2008 | Mii et al. | 257/780 |
| 2008/0211084 A1 | 9/2008 | Chow et al. | |
| 2008/0284045 A1 | 11/2008 | Gerber et al. | |
| 2008/0303153 A1 | 12/2008 | Oi et al. | |
| 2008/0308609 A1* | 12/2008 | Felber | 228/1.1 |
| 2008/0315385 A1 | 12/2008 | Gerber et al. | |
| 2009/0014876 A1 | 1/2009 | Youn et al. | |
| 2009/0026609 A1 | 1/2009 | Masuda | |
| 2009/0045497 A1 | 2/2009 | Kagaya et al. | |
| 2009/0050994 A1 | 2/2009 | Ishihara et al. | |
| 2009/0085185 A1 | 4/2009 | Byun et al. | |
| 2009/0085205 A1 | 4/2009 | Sugizaki | |
| 2009/0091009 A1 | 4/2009 | Corisis et al. | |
| 2009/0102063 A1 | 4/2009 | Lee et al. | |
| 2009/0104736 A1 | 4/2009 | Haba et al. | |
| 2009/0127686 A1 | 5/2009 | Yang et al. | |
| 2009/0128176 A1 | 5/2009 | Beaman et al. | |
| 2009/0160065 A1 | 6/2009 | Haba et al. | |
| 2009/0189288 A1 | 7/2009 | Beaman et al. | |
| 2009/0206461 A1 | 8/2009 | Yoon | |
| 2009/0212442 A1 | 8/2009 | Chow et al. | |
| 2009/0236700 A1 | 9/2009 | Moriya | |
| 2009/0236753 A1 | 9/2009 | Moon et al. | |
| 2009/0261466 A1 | 10/2009 | Pagaila et al. | |
| 2009/0315579 A1 | 12/2009 | Beaman et al. | |
| 2010/0007009 A1 | 1/2010 | Chang et al. | |
| 2010/0007026 A1 | 1/2010 | Shikano | |
| 2010/0025835 A1 | 2/2010 | Oh et al. | |
| 2010/0052135 A1 | 3/2010 | Shim et al. | |
| 2010/0065963 A1* | 3/2010 | Eldridge et al. | 257/734 |
| 2010/0078789 A1 | 4/2010 | Choi et al. | |
| 2010/0078795 A1 | 4/2010 | Dekker et al. | |
| 2010/0087035 A1 | 4/2010 | Yoo et al. | |
| 2010/0090330 A1 | 4/2010 | Nakazato | |
| 2010/0109138 A1 | 5/2010 | Cho | |
| 2010/0117212 A1 | 5/2010 | Corisis et al. | |
| 2010/0133675 A1 | 6/2010 | Yu et al. | |
| 2010/0224975 A1 | 9/2010 | Shin et al. | |
| 2010/0232129 A1 | 9/2010 | Haba et al. | |
| 2010/0237471 A1 | 9/2010 | Pagaila et al. | |
| 2010/0314748 A1 | 12/2010 | Hsu et al. | |
| 2010/0327419 A1 | 12/2010 | Muthukumar et al. | |
| 2011/0068453 A1 | 3/2011 | Cho et al. | |
| 2011/0115081 A1 | 5/2011 | Osumi | |
| 2011/0140259 A1 | 6/2011 | Cho et al. | |
| 2011/0147911 A1 | 6/2011 | Kohl et al. | |
| 2011/0241193 A1 | 10/2011 | Ding et al. | |
| 2011/0272449 A1 | 11/2011 | Pirkle et al. | |
| 2012/0043655 A1 | 2/2012 | Khor et al. | |
| 2012/0086130 A1 | 4/2012 | Sasaki et al. | |
| 2012/0119380 A1 | 5/2012 | Haba | |

FOREIGN PATENT DOCUMENTS

| | | |
|---|---|---|
| EP | 2234158 A1 | 9/2010 |
| JP | 61125062 A | 6/1986 |
| JP | 62-226307 | 10/1987 |
| JP | 1012769 A | 1/1989 |
| JP | 64-71162 | 3/1989 |
| JP | 06268015 A | 9/1994 |
| JP | 07-122787 A | 5/1995 |
| JP | 11-074295 A | 3/1999 |
| JP | 11135663 A | 5/1999 |
| JP | 11251350 A | 9/1999 |
| JP | 2001196407 A | 7/2001 |
| JP | 2002289769 A | 10/2002 |
| JP | 2003122611 A | 4/2003 |
| JP | 2003-174124 | 6/2003 |
| JP | 2003307897 A | 10/2003 |
| JP | 2004281514 A | 10/2004 |
| JP | 2004327856 A | 11/2004 |
| JP | 2004343030 A | 12/2004 |
| JP | 2005011874 A | 1/2005 |
| JP | 2003377641 A | 6/2005 |
| JP | 2005142378 A | 6/2005 |
| JP | 2003426392 A | 7/2005 |
| JP | 2005183880 A | 7/2005 |
| JP | 2005203497 A | 7/2005 |
| JP | 2005302765 A | 10/2005 |
| JP | 2007123595 A | 5/2007 |
| JP | 2007287922 A | 11/2007 |
| JP | 2008251794 A | 10/2008 |
| JP | 2009004650 A | 1/2009 |
| JP | 2009260132 A | 11/2009 |
| JP | 2010103129 A | 5/2010 |
| JP | 2010206007 A | 9/2010 |
| KR | 100265563 B1 | 9/2000 |
| KR | 2001-0094894 A | 11/2001 |
| KR | 20020058216 A | 7/2002 |
| KR | 10-0393102 B1 | 7/2003 |
| KR | 20060064291 A | 6/2006 |
| KR | 20080020069 A | 3/2008 |

(56) References Cited

FOREIGN PATENT DOCUMENTS

| KR | 100865125 B1 | 10/2008 |
|---|---|---|
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| WO | 02/13256 A1 | 2/2002 |
| WO | 2006050691 A2 | 5/2006 |
| WO | 2008065896 A1 | 6/2008 |

OTHER PUBLICATIONS

North Corporation, "Processed Intra-layer Interconnection Material for PWBs [Etched Copper Bump with Copper Foil]," NMBITM, Version 2001.6.
Kim et al., "Application of Through Mold Via (TMV) as PoP base package", 6 pages (2008).
International Search Report, PCT/US2005/039716, Apr. 5, 2006.
International Search Report Application No. PCT/US2011/024143, dated Sep. 14, 2011.
Korean Search Report KR10-2011-0041843 dated Feb. 24, 2011.
International Search Report and Written Opinion PCT/US2011/044342 dated May 7, 2012.
Bang, U.S. Appl. No. 10/656,534, filed Sep. 5, 2003.
International Search Report and Written Opinion for Application No. PCT/US2011/044346 dated May 11, 2012.
Partial International Search Report from Invitation to Pay Additional Fees for Application No. PCT/US2012/028738 dated Jun. 6, 2012.
Korean Office Action for Application No. 10-2011-0041843 dated Jun. 20, 2011.
"EE Times Asia" [online]. [Retrieved Aug. 5, 2010]. Retrieved from internet. <http://www.eetasia.com/ART_8800428222_480300_nt_dec52276.HTM>, 4 pages.
Redistributed Chip Package (RCP) Technology, Freescale Semiconductor, 2005, 6 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
Jin, Yonggang et al., "STM 3D-IC Package and 3D eWLB Development," STMicroelectronics Singapore/STMicroelectronics France May 21, 2010.
Yoon, PhD, Seung Wook, "Next Generation Wafer Level Packaging Solution for 3D integration," May 2010, STATS ChipPAC Ltd.
Search Report from Korean Patent Applicatin No. 10-2010-0113271 dated Jan. 12, 2011.
International Search Report and Written Opinion for PCT/US2011/060551 dated Apr. 18, 2012.
Meiser S, "Klein Und Komplex", Elektronik, IRL Press Limited, DE, vol. 41, No. 1, Jan. 7, 1992, pp. 72-77, XP000277326. (International Search Report for Application No. PCT/US2012/060402 dated Feb. 21, 2013 provides concise statement of relevance.).
Partial International Search Report for Application No. PCT/US2012/060402 dated Feb. 21, 2013.
International Search Report and Written Opinion for Application No. PCT/US2012/060402 dated Apr. 2, 2013.
Partial International Search Report for Application No. PCT/US2013/026126 dated Jun. 17, 2013.
International Search Report and Written Opinion for Application No. PCT/US2013/026126 dated Jul. 25, 2013.
Extended European Search Report for Application No. EP13162975 dated Sep. 5, 2013.
International Search Report and Written Opinion for Application No. PCT/US2013/052883 dated Oct. 21, 2013.
Japanese Office Action for Application No. 2013-509325 dated Oct. 18, 2013.
Office Action from U.S. Appl. No. 12/769,930 mailed May 5, 2011.
International Search Report and Written Opinion for Application No. PCT/US2013/053437 dated Nov. 25, 2013.
International Search Report and Written Opinion for Application No. PCT/US2013/041981 dated Nov. 13, 2013.
International Search Report and Written Opinion for Application No. PCT/US2014/064960 dated Mar. 17, 2015.

* cited by examiner

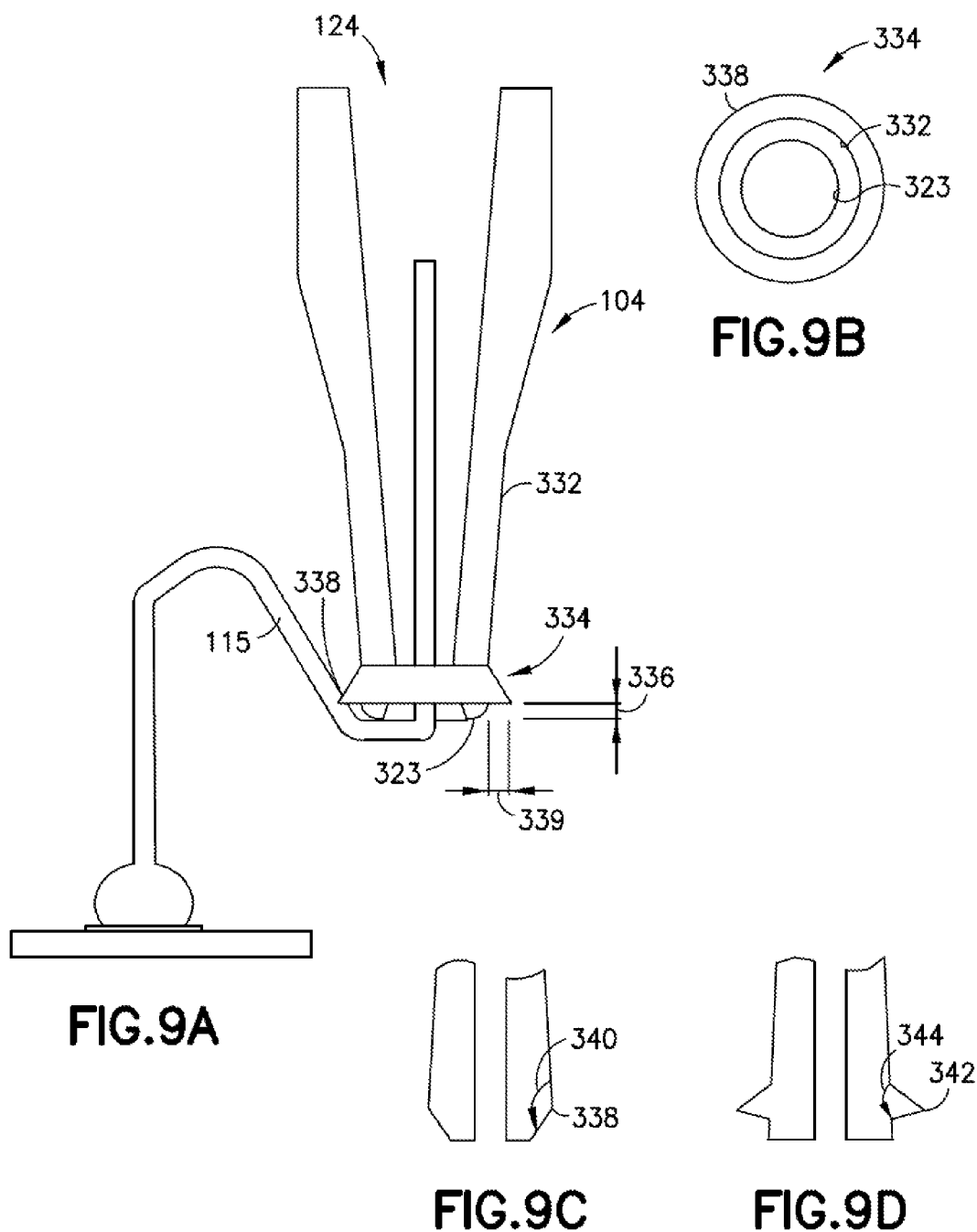

SEVERING BOND WIRE BY KINKING AND TWISTING

CROSS-REFERENCE TO RELATED APPLICATION

This application is a continuation-in-part of U.S. application Ser. No. 14/077,597 filed Nov. 12, 2013, the disclosure of which is incorporated by reference herein.

BACKGROUND OF THE INVENTION

1. Field of the Invention

The subject matter of the present application relates to fabrication of microelectronic components, packages, and assemblies, such items having bond wires which function as interconnects extending at least partially in a generally vertically direction.

2. Description of the Related Art

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Packaged semiconductor chips are often provided in "stacked" arrangements, wherein one package is provided, for example, on a circuit board, and another package is mounted on top of the first package. These arrangements can allow a number of different chips to be mounted within a single footprint on a circuit board and can further facilitate high-speed operation by providing a short interconnection between packages. Often, this interconnect distance is only slightly larger than the thickness of the chip itself. For interconnection to be achieved within a stack of chip packages, it is necessary to provide structures for mechanical and electrical connection on both sides of each package (except for the topmost package). This has been done, for example, by providing contact pads or lands on both sides of the substrate to which the chip is mounted, the pads being connected through the substrate by conductive vias or the like. Solder balls or the like have been used to bridge the gap between the contacts on the top of a lower substrate to the contacts on the bottom of the next higher substrate. The solder balls must be higher than the height of the chip in order to connect the contacts. Examples of stacked chip arrangements and interconnect structures are provided in U.S. Patent App. Pub. No. 2010/0232129 ("the '129 Publication"), the disclosure of which is incorporated by reference herein in its entirety.

Microcontact elements in the form of elongated posts or pins may be used to connect microelectronic packages to circuit boards and for other connections in microelectronic packaging. In some instances, microcontacts have been formed by etching a metallic structure including one or more metallic layers to form the microcontacts. The etching process limits the size of the microcontacts. Conventional etching processes typically cannot form microcontacts with a large ratio of height to maximum width, referred to herein as "aspect ratio". It has been difficult or impossible to form arrays of microcontacts with appreciable height and very small pitch or spacing between adjacent microcontacts. Moreover, the configurations of the microcontacts formed by conventional etching processes are limited.

Despite all of the above-described advances in the art, still further improvements in making and testing microelectronic packages would be desirable.

SUMMARY OF THE INVENTION

An electrically conductive lead can be formed using a bonding tool. In one embodiment, after bonding the wire to a metal surface and extending a length of the wire beyond the bonding tool, the wire is clamped. Movement of the bonding tool can impart a kink to the wire at a location where the wire is fully separated from any metal element other than the bonding tool. A forming element, e.g., an edge or a blade skirt provided at an exterior surface of the bonding tool can help kink the wire. Tensioning the wire using the bonding tool and twisting the wire, causes the wire to break and define an end. The lead then extends from the metal surface to the end.

In one example, twisting of the wire comprises imparting relative rotational motion between the bonding tool and the metal surface about an axis in a direction of a length of the wire. In one example, the relative rotational motion may be less than or equal to one full rotation, wherein one full rotation means a full rotation of the bonding tool or the metal surface relative to one another about an axis oriented in a direction of a length of the wire. In one particular example, the relative rotational motion may be repeated a number of times, e.g., ten times in order to sever the wire.

In a method according to one example, an electrically conductive lead of a component can be formed by steps comprising: using a bonding tool to bond a wire extending beyond a surface of a bonding tool to a metal surface; drawing the bonding tool away from the metal surface while allowing the wire to extend farther from the surface of the bonding tool; clamping the wire to limit further extension of the wire beyond the surface of the bonding tool; moving the bonding tool while the wire remains clamped such that the bonding tool imparts a kink to the wire at a location where the wire is fully separated from any metal element other than the bonding tool; and twisting the wire and tensioning the wire using the bonding tool such that the wire breaks at the kink to define an end, wherein the lead comprises the wire extending from the metal surface to the end.

The wire processed and severed in this manner may show signs of the torsional force described herein, such as having a twisted surface about the axis of the wire, or may have a twisted shape, such as a pigtail. This effect may occur along the entire length of the wire or may be restricted only to a portion of the length of the wire or a region, such as near the free end of the wire.

Various components can incorporate the leads formed in accordance with the embodiments of the method provided herein.

Various movements of the bonding tool and shapes of conductive leads can be achieved in accordance with the embodiments of the method provided herein.

BRIEF DESCRIPTION OF THE DRAWINGS

FIG. 9A is a sectional view illustrating a stage of kinking a wire in a method according to an embodiment of the invention, and illustrating a particular example of a bonding tool.

FIG. 9B is a corresponding plan view of the bonding tool shown in FIG. 9A.

FIG. 9C is a sectional view illustrating a particular example of a bonding tool.

FIG. 9D is a sectional view illustrating a particular example of a bonding tool.

DETAILED DESCRIPTION

Figure 1:
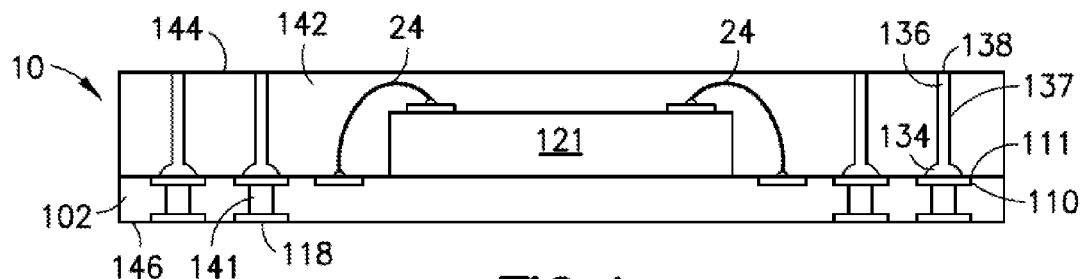
FIG. 1 is a sectional view illustrating a microelectronic package such as fabricated in accordance with an embodiment of the invention.

Referring to FIG. 1, the processes described herein can be used to form electrically conductive leads 137 which extend from metal pads 110 at a surface 111 of a component to a second surface 144 above the component surface where the leads can be interconnected with corresponding features of a second component, or in some cases, with pads, vias, or traces of a redistribution layer. A "lead" refers to an electrically conductive element configured to conduct an electrical current between a contact, e.g., an electrically conductive pad, at a surface of a system or component thereof, e.g., a microelectronic element, a substrate, an interposer, or a circuit panel, among others, to a location at a height above a plane in which the surface lies. An end of the lead remote from the contact may be exposed for further connection to another component or system. Alternatively, the lead may function as an interconnect, e.g., a via, between the contact and a level of an assembly higher than the contact.

As used in this disclosure with reference to a component, e.g., an interposer, microelectronic element, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate.

As used herein, a statement that an element is disposed "above a surface" or "overlying a surface" means at a location which is in an orthogonal direction away from the surface. A statement that one element is "above" or "upward from" a reference plane means at a location in an orthogonal direction away from the reference plane. Movement of an element in an "upward" direction means in a direction to a greater height above a reference plane defined by the surface. Conversely, movement of an element in a "downward" direction means in a direction to a lower height above a reference plane defined by the surface. All such statements and meanings of the foregoing terms are not in a gravitational reference, but rather in the frame of reference defined by the element itself.

Figure 2:
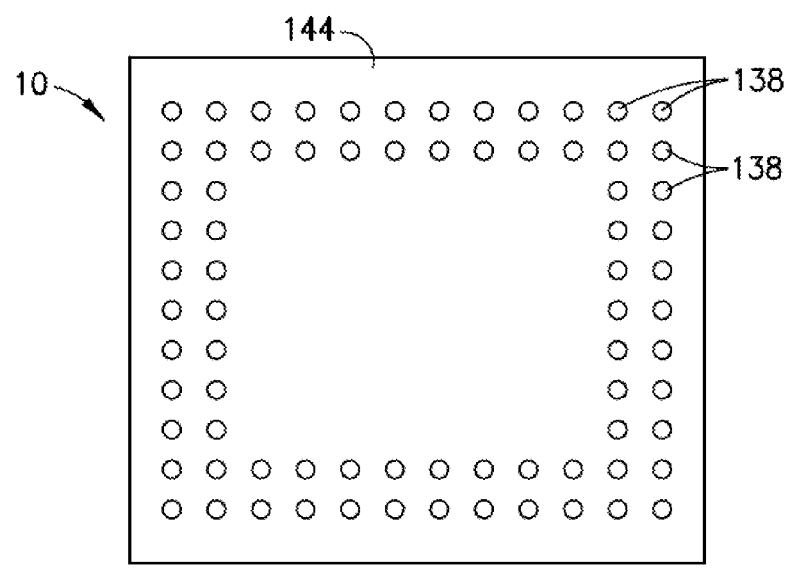
FIG. 2 is a plan view of the microelectronic package of FIG. 1.

As seen in FIGS. 1-2, leads 137 can be arranged as an array of wire bonds bonded to surfaces of metal pads or other features at the component surface, the leads extending away from the metal pads at least partly in an upward direction. Such "bond via array" can provide vertical interconnects for a variety of components and microelectronic assemblies. For example, a microelectronic package 10 may have a plurality of leads 137 which are available at an upper surface 144 thereof for interconnection with an additional microelectronic package (not shown) disposed above the surface 144. Each of the leads 137 has an end 134 bonded to a metal surface of a pad 110 or metal feature at a surface 111 of a dielectric element such as substrate 102. The leads 137 can extend in an upwardly direction through a dielectric material such as encapsulation 142, the leads 137 having ends 138 at a surface 144 of the dielectric element. In the package 10, portions of edge surfaces 136 of the leads may or may not be uncovered by a dielectric material used to form the encapsulation 142.

As further seen in FIG. 1, the package 10 can comprise a microelectronic element 121. Specifically, structure 10 can be a microelectronic assembly or package which includes a microelectronic element 121 electrically interconnected with a substrate 102. The microelectronic element 121 may be mounted face up to substrate 102 using an adhesive (not shown), with wire bonds 24 or other conductive structure electrically coupling the microelectronic element 121 with the substrate 102. The microelectronic package can further include terminals 148 at a lower surface 146 of the package which are available for connection with elements of another component at or below the terminals 148. For example, terminals 148 can be bonded to corresponding contacts of a circuit panel or other microelectronic package through conductive masses such as solder balls (not shown), for example.

Figure 3A:
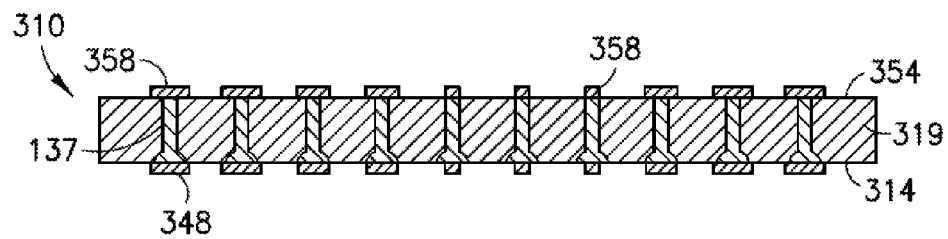
FIG. 3A is a sectional view illustrating an interposer such as fabricated in accordance with an embodiment of the invention.
Figure 3B:
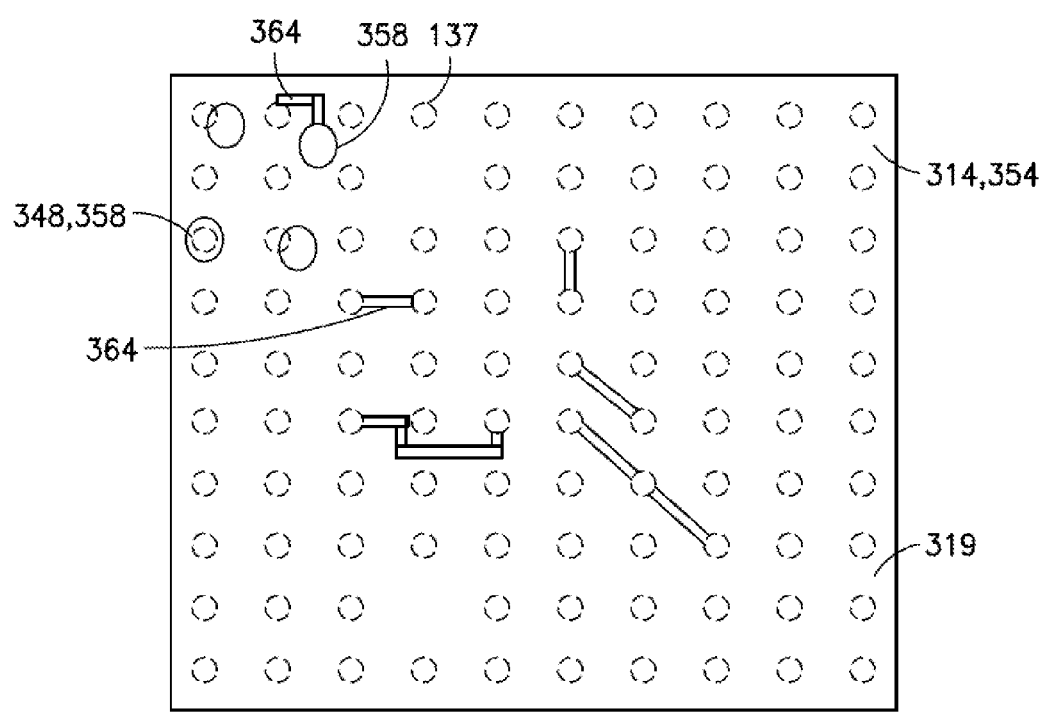
FIG. 3B is a plan view of the interposer of FIG. 3A.

In another example, as seen in FIGS. 3A-B, the leads 137 can provide interconnects for electrically coupling a first set of contacts 348, e.g., pads, at a first surface 314 of a dielectric element 319 of an interposer 310 with a second set of contacts 358, e.g., pads, at a second surface 354 of the interposer. The dielectric element 319 can be formed by molding a dielectric material onto the leads 137 to form an encapsulation. An electrically conductive redistribution layer can be provided at one or both of the first and second surfaces 314, 354. The redistribution layer can comprise contacts 348, 358 and traces 364 which extend along one or both of the surfaces 314, 354 and which can be provided for redistributing the contacts and can be provided for electrically coupling one or more of the contacts, or one or more of leads 137 or both.

Figure 4:
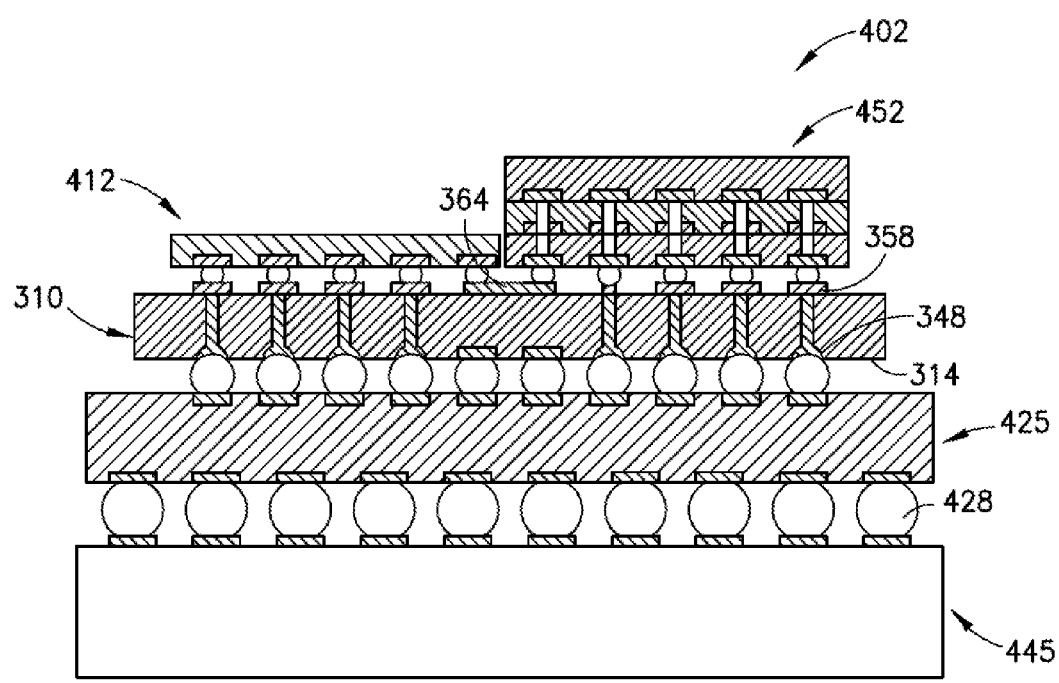
FIG. 4 is a sectional view illustrating a microelectronic assembly such as may incorporate the interposer of FIGS. 3A-3B.

FIG. 4 depicts an example microelectronic assembly 402 in which interposer 310 can be assembled with microelectronic components 412, 452, and may electrically couple the microelectronic elements through elements of a redistribution layer thereon such as traces 364. The interposer can be electrically coupled to a package substrate 425 through elements such as electrically conductive masses, e.g., solder balls attached to contacts 348 at a surface 314 of the interposer 310. In turn, the package substrate 425 can be electrically coupled to a circuit panel 445, such as through conductive masses 428, e.g., solder balls.

In other variations, one or more of the components seen in FIG. 4 may not be present. For example, the assembly may include only one microelectronic element 412 or 452. In some cases, the package substrate 425 may be omitted. In one example, the circuit panel 445 may be electrically coupled to other components in the assembly 402 in ways other than shown in FIG. 4.

Figure 5:
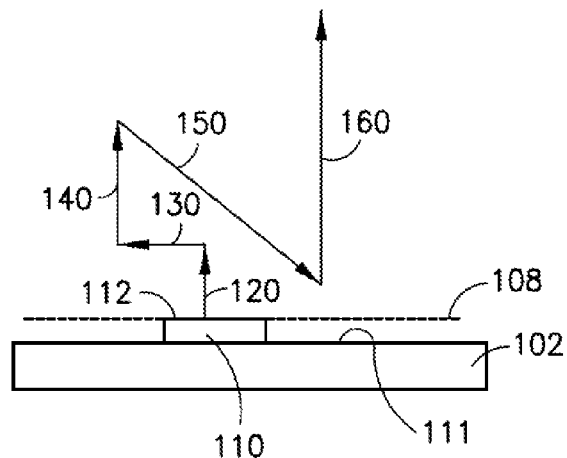
FIG. 5 is a schematic drawing representing movement of a bonding tool in accordance with a method of forming a lead according to an embodiment of the invention.
Figure 6:
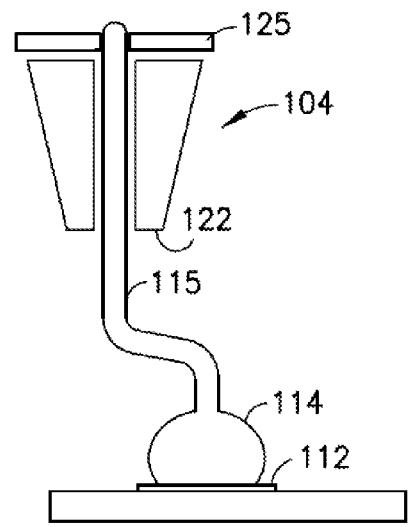
FIG. 6 illustrates a stage in forming a lead according to an embodiment of the invention.

Turning now to FIGS. 5 through 8A, a method will be described for forming an electrically conductive lead of a component such as any of the components described above. In this embodiment, the bonding tool can be moved in directions and in a sequential order along segments 120, 130, 140, 150 and 160 of a path such as illustrated in FIG. 5. Referring to FIG. 6, in a first stage of forming the lead, a bonding tool 104 bonds the wire 115 to a metal surface, such as surface 112 of a pad 110 at a surface of a substrate 102 or other component, for example. In one example, the bonding tool 104 can be a capillary type bonding tool in which a wire 115 is fed out through a central opening of the capillary in a direction substantially orthogonal to a surface 122 of the bonding tool.

When bonding the wire, a ball bond 114 may be formed at an end of the wire that is joined to the metal surface 112, which may result from applying energy to a portion of the wire exposed beyond surface 122 as the bonding tool surface 122 is moved or positioned adjacent to the metal surface 112. After applying energy to form the bond to the metal surface 112, the bonding tool draws away from the metal surface 112. Referring to FIG. 6, since one end of the wire 115 is bonded to the metal surface 112, the drawing away of the bonding tool causes the wire to extend farther beyond a surface 122 of the bonding tool. Also, when drawing the bonding tool away from the metal surface, the bonding tool can be moved in an upward direction along path segment 120 away from a reference plane 108 defined by the metal surface 112. In one example, movement along path segment 120 can be in a direction substantially orthogonal to the surface 111 of the component. After moving the bonding tool upwardly along path segment 120, the bonding tool may be moved in a lateral direction along path segment 130, which may be substantially parallel to the surface 111. The bonding tool may then be moved upwardly along path segment 140 as shown in FIG. 5. The above-described motion of the bonding tool can cause a predetermined length of the wire of at least 50 microns to extend between the surface 122 of the bonding tool and the metal surface 112. As commonly understood, as used herein a "micron" means a millionth of a meter, i.e., a micrometer.

At this stage, the shape of the wire 115 and the position of the bonding tool 104 relative to the metal surface 112 can be as shown in FIG. 6. As depicted in FIG. 6, a clamp 125 can engage the wire 115 to prevent or limit further extension of the wire beyond the surface 122 of the bonding tool. In one example, the wire can be clamped at the stage of processing shown in FIG. 6. The clamping of the wire prevents or limits further extension of the wire in a direction beyond the surface 122 of the bonding tool.

Referring again to FIG. 5, after clamping the wire 115, the bonding tool 104 may now be moved along path segment 150 in a different direction than before. This movement of the bonding tool can be used to impart a kink to the wire 115.

In one example, the bonding tool can be moved along path segment in a lateral direction other than the lateral direction of travel along the previous path segment 130. Movement along path segment 150 may also be in a downward direction towards the reference plane 108 defined by the metal surface 112. The path may include any combination of movements in the x-, y-, or z-directions relative to the reference plane. The movements may be a series of straight lines or one or more curves. In examples, some or part of the movements may comprise motion of the surface 122 of the bonding tool in a loop or motion in a spiral. Moreover, the tool and/or the wire may be rotated or twisted during the process to further aid in forming the kink or shaping any portion of the wire.

In one example, the bonding tool may impart a kink 116 to a location of the wire 115 proximate a surface 122 of the tool. As further explained below, the kink manifests as a locally weakened location of the wire where tension applied to the wire in a longitudinal direction of the wire can cause the wire to break at the weakened location. The kink may coincide with a local reduction in the diameter or width of the wire in at least one direction.

Figure 7:
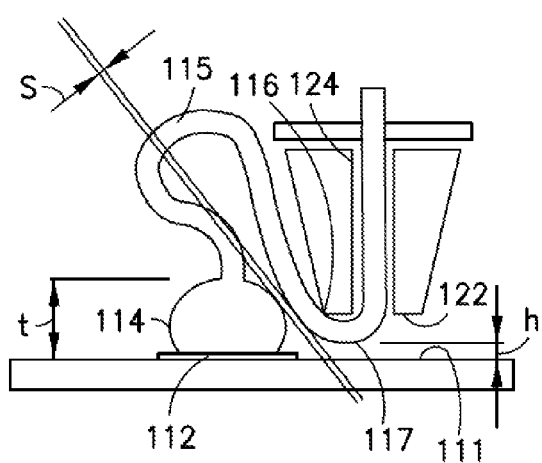
FIG. 7 illustrates a further stage in forming a lead according to an embodiment of the invention.

As seen in FIG. 7, contact between wire 115 at an edge of the surface 112 of the bonding tool can assist in imparting the kink 116 to the wire. As also seen in FIG. 7, movement of the bonding tool forms the kink in the wire at a location where the wire is fully separated from any metal element other than that provided on the bonding tool. That is, the kink can be formed without crushing the wire between the bonding tool and another metal element that is stationary or moving separately from the bonding tool. In this way, the kink in the wire can be said to be formed "in air". In the example shown in FIG. 7, the kink is formed while a lowermost surface 117 of the wire is separated from a surface 111 of the component, e.g., substrate 102, or other component at a height "h" therefrom. During movement of the wire which imparts the kink, the wire also remains separated from a surface of a ball bond 114 between the wire and the metal surface 112, that separation distance "s" being depicted in FIG. 7.

In a particular example, when the wire is joined to the metal surface 112 by a ball bond 114, and when forming the kink, the wire can be moved to within 100 microns of a surface of the ball bond 114 that bonds the wire 115 to the metal surface 112, without the wire contacting the ball bond 114. In a further example, when forming the kink, the wire can be moved to within 20 microns of a surface of the ball bond 114 that bonds the wire 115 to the metal surface 112, without the wire contacting the ball bond 114.

In a particular example, the bonding tool can be moved in such way that the surface 122 of the bonding tool, or a portion of the wire 115 projecting below that surface 122, or both the surface 122 and the wire 115 underlying that surface 122, is at a height from the component surface 111 that is lower than a thickness dimension "t" of a ball bond that joins an end of the wire to the metal surface 112.

After forming the kink, the bonding tool then is moved in a way that tensions the wire in a longitudinal direction of the wire. Moreover, as seen by arrows 60, 62, to further facilitate the severing of the wire, while applying or maintaining the tension on the wire, one or both of the bonding tool or the metal surface, which may be supported on an element 112, e.g., a component or dielectric element 102 (FIG. 5) can be rotated relative to the other of the metal surface or bonding tool about an axis extending in a direction of a length of the wire. The relative rotational movement between the bonding tool and the metal surface 112 twists the wire, i.e., applies a torsional force thereto. In one example, the bonding tool and not the metal surface may be rotated relative to the metal surface while the wire is under tension. In another example, the metal surface and not the bonding tool can be rotated while the wire is under tension. In still another example, each of the bonding tool and the metal surface can be rotated relative to the other of the bonding tool or the metal surface.

Figure 8A:
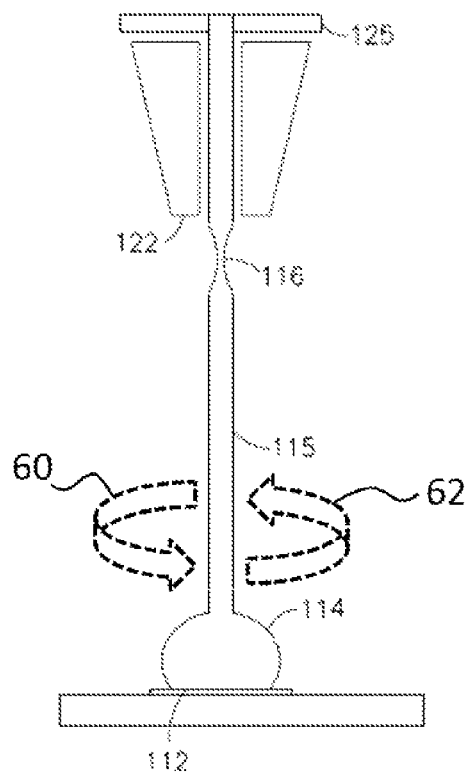
FIG. 8A illustrates a further stage in forming a lead according to an embodiment of the invention.
Figure 8B:
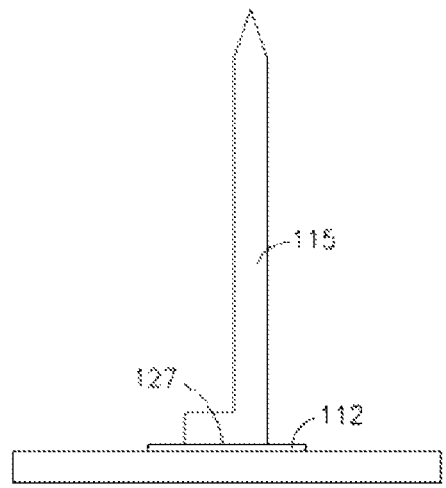
FIG. 8B illustrates a lead formed according to an embodiment of the invention in which the lead has an edge bonded to the metal surface using a stitch bond or wedge bond technique.

As implied by arrows 60, 62, rotation can be either in a clockwise or counterclockwise direction. In one embodiment, the relative rotation between the bonding tool and the metal surface may be less than one full rotation. As used herein, "one full rotation" means a full rotation of the bonding tool or the metal surface relative to one another about an axis oriented in a direction of the length of the wire. In another embodiment, the relative rotational motion between the bonding tool and the metal surface can be less than one full rotation and may be repeated several times, e.g., up to ten times to sever the wire and form a structure wherein an upwardly projecting end of the wire bond points up as seen in FIG. 8B. In a specific example of operation, as seen in FIG. 8A, the bonding tool can be moved in an upwardly direction relative to the metal surface 112 and relative to the ball bond 114. The clamp 125 prevents movement of the wire in the longitudinal direction of the wire. Relative rotational movement between the bonding tool and the metal surface 112 can also twist the wire. Because the wire is weakened at the location of the kink 116, or the geometry of the wire at the kink concentrates stress at the location of the kink, tensioning and twisting the wire causes the wire to be severed at the location of the kink 116. As a result, a portion of the wire 115 that forms a lead is severed at the location of the kink 116 from another portion of the wire that extends within the bonding tool 104.

The wire 115 processed and severed in this manner may show signs of the torsional force described herein, such as having a twisted surface about the axis of the wire, or may have a twisted shape, such as a pigtail. This effect may occur along the entire length of the wire 115 or may be restricted only to a portion of the length of the wire or a region, such as near the free end of the wire.

After forming the lead, the lead may be plated with an electrically conductive barrier material to reduce or avoid diffusion between the metal of which the lead is formed and a bond metal, e.g., solder, or gold which may be used in further bonding the lead to another element or other component. In one example, the conductive barrier can be palladium. In other examples, without limitation, the barrier metal can include one or more of nickel, tungsten, titanium, phosphorus, cobalt, and conductive compounds of the same.

In a variation of the above-described embodiment, the wire can be twisted by relative rotational movement of the bonding tool relative to the metal surface at a time after forming the kink but prior to using the bonding tool to tension the wire. In another variation, twisting of the wire can begin prior to tensioning the wire, the twisting continuing when the bonding tool applies the tension to the wire.

Referring to FIG. 8B, in a variation of the method shown and described relative to FIGS. 5 through 8A, the lead shown in FIG. 8B can be formed with a different type of bond between the wire 115 and the metal surface 112. In this case, the wire can be bonded to the metal surface with a stitch bond or wedge bond in which an edge 127 of the wire 115 is bonded to the metal surface 112 and the wire 115 bends upwardly away from the metal surface 112. In this case, the bonded end 134 of the lead seen in FIG. 1 is the portion of the wire that is stitch-bonded to the metal surface. The formation of the stitch bond or wedge bond between the wire and the metal surface 112 can be as further described in U.S. application Ser. No. 13/404,408 filed Feb. 24, 2012, the disclosure of which is incorporated by reference herein. In still another example, the bonding tool can be a wedge-bonding tool rather than a capillary type tool, which can be used to form a wedge bond between the wire and the metal surface.

FIGS. 9A-B depict a particular bonding tool arrangement which can be used in accordance with the above-described method of forming a lead. In this example, the bonding tool 104 can include a forming element 334 at an exterior surface 332 of the bonding tool 104. In the example shown in FIG. 9A, the forming element 334 can be provided at an exterior generally cylindrical or frustoconical wall surface 332 of the bonding tool which surrounds the central opening 124 of the bonding tool through which the wire extends. In this case, the forming element can be disposed at some distance from an entrance 323 of the central opening 124. When the bonding tool is moved after the wire is clamped per the description provided above relative to FIGS. 5 through 7, the forming element can assist in imparting the kink. Movement of the bonding tool forces the wire against the forming element 334.

In a particular embodiment, the forming element 334 can include an edge 338 against which the wire is forced during the movement of the bonding tool. As seen in FIG. 9C, for example, the edge 338 of the forming element exists at a junction of two surfaces which meet with an angle 340 of less than 180 degrees passing through an interior of the forming element. In one example, the edge 342 can be a "knife edge", i.e., an edge at the junction of two surfaces which meet an interior angle 344 measuring less than 90 degrees. In a further example, the interior angle 344 of the two surfaces which form the edge 342 will be smaller. In some cases, it may be beneficial to limit the angle 344 to 75 degrees or less, and in other cases, it may be beneficial to limit the angle 344 to 60 degrees or less. When the edge 342 is "sharp", i.e., having a relatively small interior angle between the surfaces of typically less than 75 degrees, the edge 342 may be forced more deeply into the wire 115 during the movement of the bonding tool. However, in such case, the height 339 of the edge 338 above an adjacent outer surface of the 332 of the bonding tool can be limited such that the edge 338 extends into the interior of the wire 115 but without severing the wire during the movement depicted in FIG. 9A. In a particular example, the edge 338 can be located at an axial distance 336 along the exterior surface 332 which is at least 0.25 times a diameter of the wire 115 used to form the lead. In the same example, or in other examples herein, the edge can be located at a height 339 above an adjacent outer surface 332 of the bonding tool which is at least 0.25 times a diameter of the wire 115 used to form the lead.

The forming element 334 can be applied to the exterior surface 332 of a bonding tool to thereby form a part of the bonding tool 104 as used in practicing a method as described herein. For example, a forming element 334 having an annular shape can be provided at an exterior surface 332 of the bonding tool, and can be attached or fitted thereon. In one example, the forming element can be a "blade skirt" which is fitted onto the exterior surface 332. In another example, the forming element may be an integrally formed portion of the exterior surface 332. In still another example, the edge 338 of the forming element may be oriented in a downward direction towards the metal surface from the bonding tool.

Figure 10A:
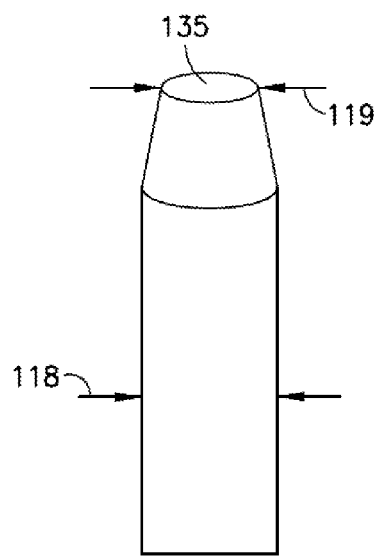
FIG. 10A is a side view illustrating a lead formed in accordance with an embodiment of the invention.
Figure 10B:
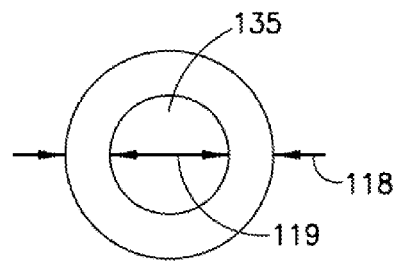
FIG. 10B is a corresponding plan view of the lead shown in FIG. 10A.
Figure 10C:
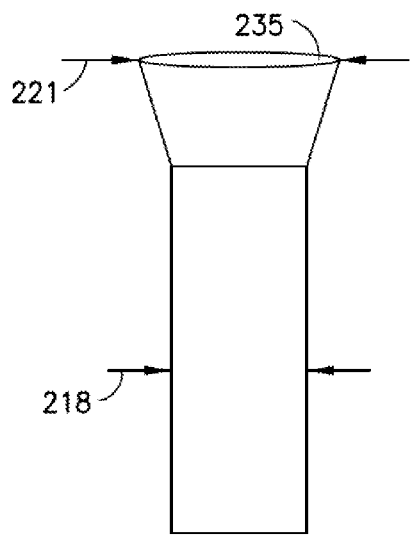
FIG. 10C is a side view illustrating a lead formed in accordance with an embodiment of the invention.
Figure 10D:
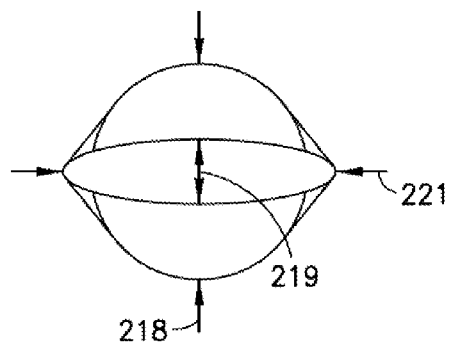
FIG. 10D is a corresponding plan view of the lead shown in FIG. 10C.

In particular examples, ends of the leads formed in this manner can have shapes such as those shown in FIGS. 10A-B. In the example seen in FIGS. 10A-B, the diameter 119 of a lead at an end 135 of the lead remote from the metal surface can be reduced relative to a normal diameter of the lead at other locations along the wire. In this case, the normal diameter of the lead can be the same as, or essentially the same as a normal diameter 118 of the wire which exists at almost all places along the length of the wire except for a location at which the wire is bonded to another element such as metal surface, and except for the end 135 of the lead. In another example, as seen in FIGS. 10C-D, the formed lead has a width 219 that is reduced in one direction relative to a normal diameter 218 of the lead which can be the same as a normal diameter of the wire, as described above. In such case, the width 221 of the lead in a second direction may be the same as, or greater than the normal diameter 218 of the lead at locations between the end 235 and the metal surface 112.

Referring again to FIG. 1, the above described processing may then be repeated to form a plurality of leads 137 each having an end bonded to a metal surface of a metal feature at a surface of a dielectric structure of the component. For example, the process can be repeated to form a plurality of leads 137 having bases 134 bonded to respective metal surfaces 112 (electrically conductive pads) at a surface 111 of a dielectric element 102, e.g., a substrate. In a further stage of processing, a dielectric element 142 can be formed which surrounds individual leads 137 of the plurality of leads, wherein the ends 138 of the leads are uncovered by the dielectric element 142 at a surface 144 of the dielectric element. In one example, the dielectric element 144 can be formed by molding an encapsulant surrounding the individual leads 137 of the plurality of leads. In the structure 10, portions of edge surfaces 136 of the leads may or may not be uncovered by a dielectric material used to form the encapsulation.

Figure 11:
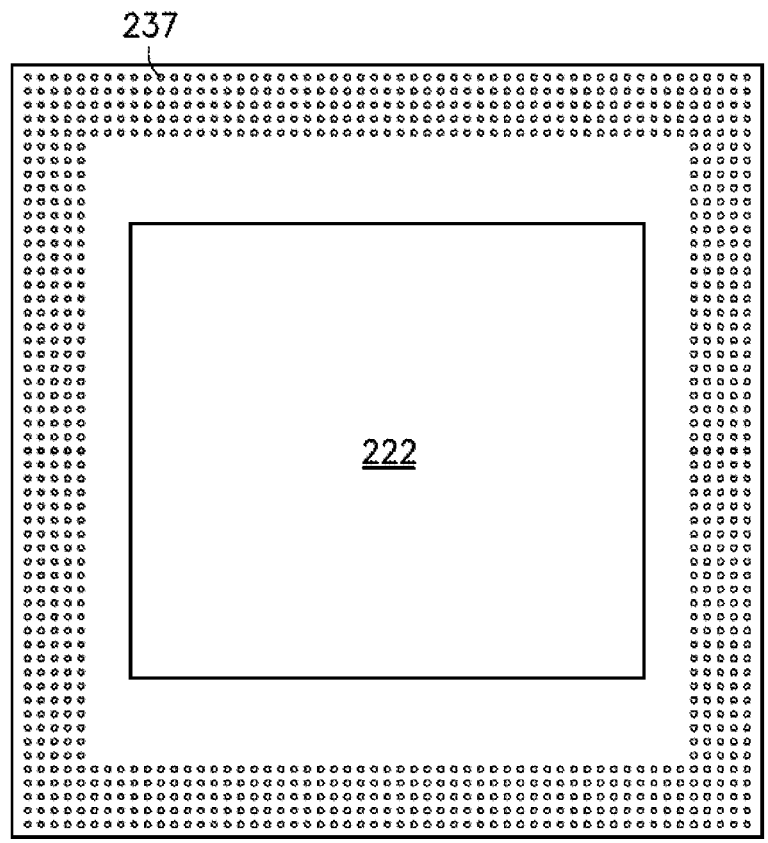
FIG. 11 is a plan view illustrating a stage in a method of forming leads according to an embodiment of the invention.
Figure 12:
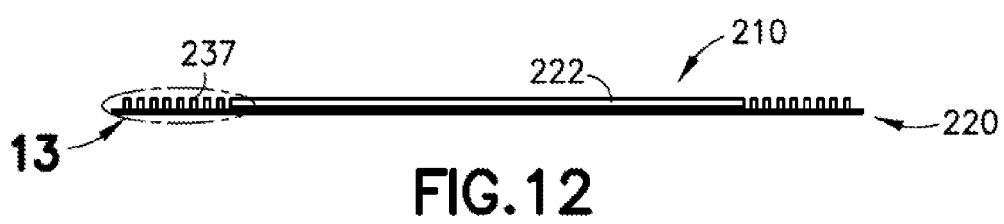
FIG. 12 is a sectional view corresponding to the plan view of FIG. 11.
Figure 13:
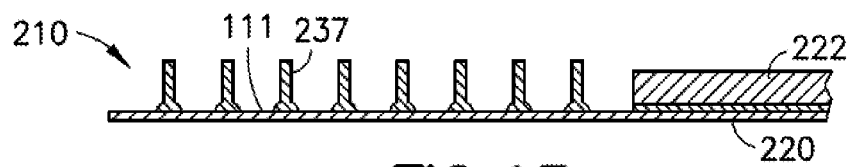
FIG. 13 is a detailed partial sectional view corresponding to FIG. 12.
Figure 14:
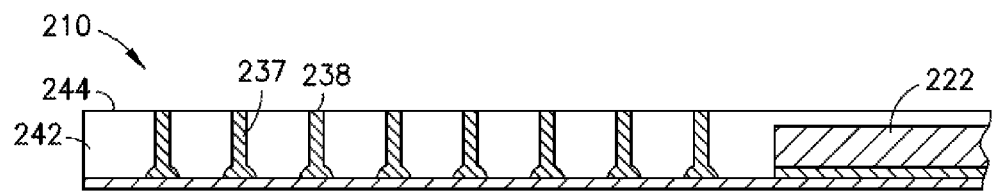
FIG. 14 is a detailed partial sectional view illustrating a stage in a fabrication method subsequent to the stage shown in FIGS. 11, 12 and 13 in accordance with such embodiment.
Figure 15:
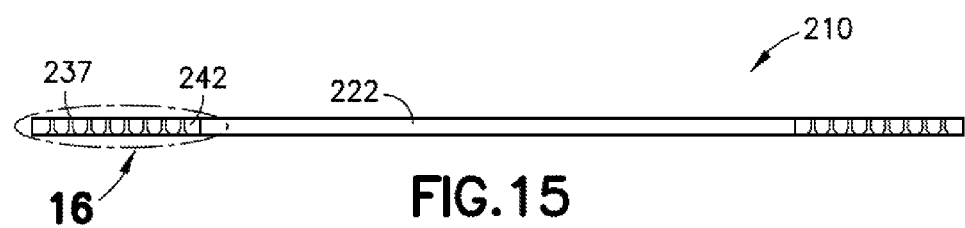
FIG. 15 is a sectional view illustrating a stage in a fabrication method subsequent to the stage shown in FIG. 14.
Figure 16:
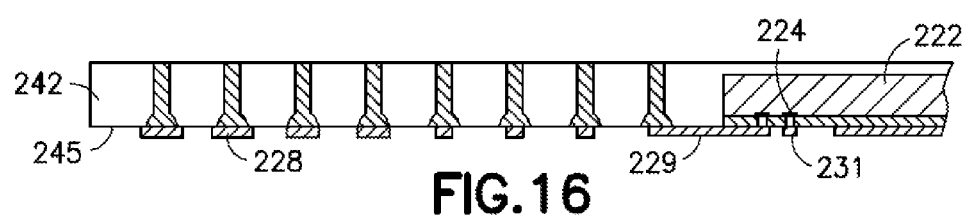
FIG. 16 is a detailed partial sectional view corresponding to FIG. 15.

In another example, a plurality of leads may be formed on a common metal surface such as shown in FIGS. 11, 12 and 13. In this example, microelectronic element 222 can be mounted to a metal sheet 220 and wires bonded to the metal sheet and formed into leads 237 in an assembly 210 in accordance with the above-described processing. Referring to FIGS. 14-15, a dielectric element 242, e.g., an encapsulation, can be formed surrounding individual leads 237 of the plurality of leads of assembly 210, with ends 238 of the leads being uncovered by the dielectric element 242 at a surface 244 of the dielectric element 242. Referring to FIG. 16, in subsequent processing, the metal element, e.g., a metal sheet 220, can be patterned to form a plurality of metal features 228 at a lower surface 245 of the dielectric element 242. The metal features can include traces 229, vias 231, etc. which electrically couple pads 228 at a surface 245 of the dielectric element, e.g., encapsulation, with contacts 224 at a surface of the microelectronic element 222.

Referring to FIGS. 17 through 20, in a variation of the above-described process of forming a lead, the bonding tool need not be moved in a manner as seen in FIG. 5 along substantially vertical path segments 120, 140 and a horizontal path segment 130. Instead, with the wire bonded to the metal surface 112, the bonding tool can be drawn away from the metal surface 112 along a path segment 230 which is at an angle relative to both the vertical direction 290 and at an angle to the horizontal direction 295. After moving the bonding tool along the path segment 230, the wire then can be clamped to prevent or limit further extension of the wire beyond the surface 122 of the bonding tool.

Figure 17:
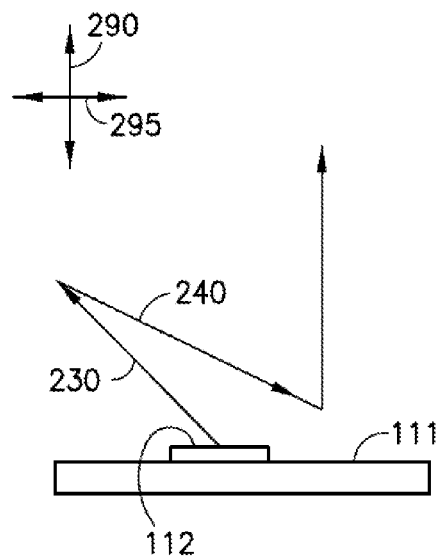
FIG. 17 is a schematic drawing representing movement of a bonding tool in accordance with a method of forming a lead according to an embodiment of the invention.
Figure 18:
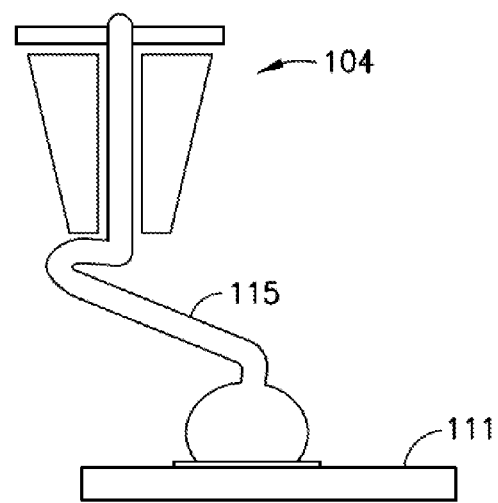
FIG. 18 illustrates a stage in forming a lead according to an embodiment of the invention.
Figure 19:
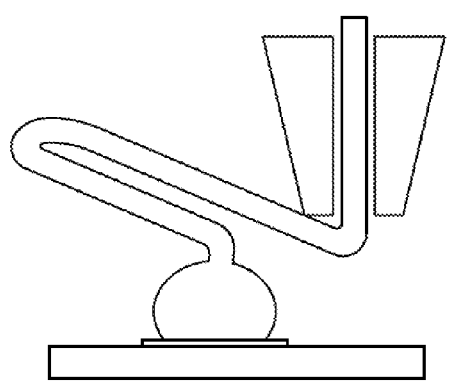
FIG. 19 illustrates a further stage in forming a lead according to an embodiment of the invention.
Figure 20:
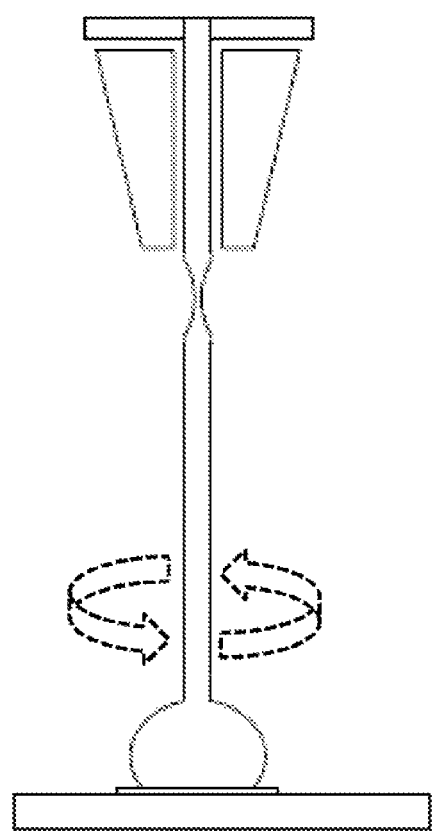
FIG. 20 illustrates a further stage in forming a lead according to an embodiment of the invention.

Thereafter, as further shown in FIGS. 17-18, the bonding tool can be moved in a direction that is both lateral relative to the surface 111 of the component and downward along path segment 240. FIG. 18 further depicts the shape of the wire 115 after the bonding tool 104 has been moved along path segment 230, after clamping the wire, and after the bonding tool has begun moving in the lateral and downward direction along path segment 240. FIG. 19 depicts the shape of the wire 115 after the bonding tool has been moved along path segments 230, 240 to a location at which a kink is applied to the wire, such as described in the foregoing. Referring to FIG. 20, further movement of the wire which causes the wire to be severed at the location of the kink can be the same that described above with reference to FIG. 8A.

Figure 21:
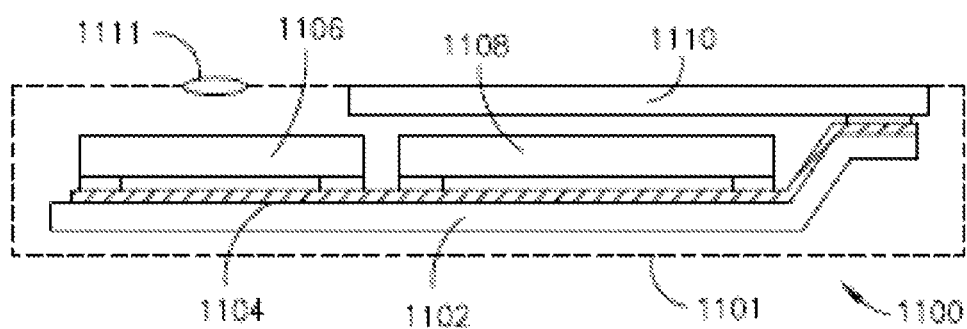
FIG. 21 is a schematic sectional view illustrating a system according to an embodiment of the invention.

The microelectronic packages and microelectronic assemblies described above with reference to FIGS. 1 through 4 and FIG. 16 can be utilized in construction of diverse electronic systems, such as the system 1100 shown in FIG. 21. For example, the system 1100 in accordance with a further embodiment of the invention includes a plurality of modules or components 1106 such as the microelectronic packages and/or microelectronic assemblies as described above in conjunction with other electronic components 1108 and 1110.

In the exemplary system 1100 shown, the system can include a circuit panel, motherboard, or riser panel 1102 such as a flexible printed circuit board, and the circuit panel can include numerous conductors 1104, of which only one is depicted in FIG. 21, interconnecting the modules or components 1106 with one another. Such a circuit panel 1102 can transport signals to and from each of the microelectronic packages and/or microelectronic assemblies included in the system 1100. However, this is merely exemplary; any suitable structure for making electrical connections between the modules or components 1106 can be used.

In a particular embodiment, the system 1100 can also include a processor such as the semiconductor chip 1108, such that each module or component 1106 can be configured to transfer a number N of data bits in parallel in a clock cycle, and the processor can be configured to transfer a number M of data bits in parallel in a clock cycle, M being greater than or equal to N. In the example depicted in FIG. 21, component 1108 can be a semiconductor chip and component 1110 is a display screen, but any other components can be used in the system 1100. Of course, although only two additional components 1108 and 1110 are depicted in FIG. 21 for clarity of illustration, the system 1100 can include any number of such components.

Modules or components 1106 and components 1108 and 1110 can be mounted in a common housing 1101, schematically depicted in broken lines, and can be electrically interconnected with one another as necessary to form the desired circuit. The housing 1101 is depicted as a portable housing of the type usable, for example, in a smartphone, tablet computer, or cellular telephone, and screen 1110 can be exposed at the surface of the housing. In embodiments where a structure 1106 includes a light-sensitive element such as an imaging chip, a lens 1111 or other optical device also can be provided for routing light to the structure. Again, the simplified system shown in FIG. 21 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A method of forming an electrically conductive lead of a component, comprising:

using a bonding tool to bond a wire extending beyond a surface of a bonding tool to a metal surface;

drawing the bonding tool away from the metal surface while allowing the wire to extend farther from the surface of the bonding tool;

clamping the wire to limit further extension of the wire beyond the surface of the bonding tool;

moving the bonding tool while the wire remains clamped such that the bonding tool imparts a kink to the wire at a location where the wire is fully separated from any metal element other than the bonding tool; and twisting the wire and tensioning the wire using the bonding tool such that the wire breaks at the kink to define an end, wherein the lead comprises the wire extending from the metal surface to the end.

2. The method as claimed in claim 1, wherein the twisting of the wire comprises imparting relative rotational motion between the bonding tool and the metal surface about an axis in a direction of a length of the wire.

3. The method as claimed in claim 2, wherein the relative rotational motion is motion of less than or equal to one full rotation.

4. The method as claimed in claim 2, wherein the relative rotational motion is motion of less than or equal to one full rotation, the relative rotational motion repeated up to ten times.

5. The method as claimed in claim 2, wherein the end of the wire has diameter in all directions which is smaller than a diameter of the wire at a location between the metal surface and the end.

6. The method as claimed in claim 2, wherein the bonding of the metal wire comprises forming a ball bond at a first end of the wire joined to the metal surface.

7. The method as claimed in claim 6, wherein the moving the bonding tool is performed such that the wire is moved to within 100 microns of a surface of the ball bond.

8. The method as claimed in claim 2, wherein a forming element is provided at an exterior surface of the bonding tool, and the moving of the bonding tool imparts the kink by forcing the wire against the forming element.

9. The method as claimed in claim 2, wherein the forming element includes an edge exposed at the exterior surface, the moving of the bonding tool imparts the kink by forcing the wire against the edge.

10. The method as claimed in claim 2, wherein the metal surface is a surface of a metal element, wherein the method includes repeating, one or more times: the using a bonding tool, drawing the bonding tool, clamping the wire, moving the bonding tool, and twisting the wire and tensioning the wire, to form a plurality of leads bonded to the metal surface, then forming a dielectric element surrounding individual leads of the plurality of leads, and patterning the metal element to form a plurality of metal features at a surface of the dielectric element, each lead bonded to a feature of the plurality of features.

11. The method as claimed in claim 2, wherein the metal surface is a surface of a metal feature of a plurality of metal features at a surface of dielectric structure of the component, and the method includes repeating, one or more times: the using a bonding tool, drawing the bonding tool, clamping the wire, moving the bonding tool, and twisting the wire and tensioning the wire, to form a plurality of leads bonded to metal surfaces of the metal features, then forming an encapsulation surrounding individual leads of the plurality of leads, wherein the ends of the leads are uncovered by the encapsulation at a surface of the encapsulation.

12. The method as claimed in claim 2, wherein the drawing the bonding tool is performed while moving the bonding tool away from the metal surface at least partly in a first lateral direction, and then moving the bonding tool at least partly in a second lateral direction opposite the first lateral direction so as to form a first bend in the wire, the first and second lateral directions being parallel to the metal surface.

13. The method as claimed in claim 2, wherein the drawing the bonding tool comprises drawing the bonding tool in an upward direction away from a reference plane defined by the metal surface, and the moving the bonding tool comprises moving the bonding tool in a downward direction towards the reference plane.

14. The method as claimed in claim 1, wherein the drawing the bonding tool comprises drawing the bonding tool in an upward direction away from a reference plane defined by the metal surface and drawing the bonding tool in a first lateral direction away from the metal surface, and then moving the bonding tool at least partly in a second lateral direction opposite the first lateral direction so as to form a first bend in the wire.

15. The method as claimed in claim 1, wherein the drawing the bonding tool comprises drawing the bonding tool in an upward direction away from a reference plane defined by the metal surface, then drawing the bonding tool at least partly in a first lateral direction parallel to the metal surface, and then drawing the bonding tool again in an upward direction away from a reference plane defined by the metal surface, and the moving the bonding tool comprises moving the bonding tool in a downward direction towards the reference plane.

16. A method of forming a component assembly having a plurality of electrically conductive leads, comprising:
    using a bonding tool to bond a wire extending beyond a surface of a bonding tool to a metal feature at a surface of a component;
    drawing the bonding tool away from the metal surface while allowing the wire to extend farther from the surface of the bonding tool;
    clamping the wire to limit further extension of the wire beyond the surface of the bonding tool;
    moving the bonding tool while the wire remains clamped such that the bonding tool imparts a kink to the wire at a location where the wire is fully separated from any metal element other than the bonding tool;
    twisting the wire and tensioning the wire using the bonding tool such that the wire breaks at the kink to define an end, wherein the lead comprises the wire extending from the metal feature to the end, wherein the twisting of the wire comprises imparting relative rotational motion between the bonding tool and the metal surface about an axis in a direction of a length of the wire;
    repeating, a plurality of times: the using a bonding tool, drawing the bonding tool, clamping the wire, moving the bonding tool, and twisting the wire and tensioning the wire to form a plurality of the leads, wherein the end of each lead is at least 50 microns from the metal surface to which it is bonded; and
    forming an encapsulation surrounding individual leads of the plurality of leads, wherein the ends of the leads are not fully covered by the encapsulation at a surface of the encapsulation.

17. The method as claimed in claim 16, wherein the using a bonding tool is performed such that a ball bond forms where the wire is bonded to the metal surface and the moving the bonding tool is performed such that the wire is moved to within 20 microns of a surface of the ball bond.

18. The method as claimed in claim 16, wherein the drawing the bonding tool is performed while moving the bonding tool away from the metal surface at least partly in a first lateral direction, and then moving the bonding tool at least partly in a second lateral direction opposite the first lateral direction so as to form a first bend in the wire, the first and second lateral directions being parallel to the metal surface, and the relative rotational motion is motion of less than or equal to one full rotation, and the relative rotational motion is performed from one to ten times.

19. The method as claimed in claim 16, wherein the drawing the bonding tool comprises drawing the bonding tool in an upward direction away from a reference plane defined by the metal surface and drawing the bonding tool in a first lateral direction away from the metal surface, and then moving the bonding tool at least partly in a second lateral direction opposite the first lateral direction so as to form a first bend in the wire.

* * * * *